US008945688B2

(12) United States Patent
Roberts, III

(10) Patent No.: US 8,945,688 B2
(45) Date of Patent: Feb. 3, 2015

(54) PROCESS OF FORMING A MATERIAL HAVING NANO-PARTICLES AND A MATERIAL HAVING NANO-PARTICLES

(75) Inventor: Herbert Chidsey Roberts, III, Greenville, SC (US)

(73) Assignee: General Electric Company, Schenectady, NY (US)

( * ) Notice: Subject to any disclaimer, the term of this patent is extended or adjusted under 35 U.S.C. 154(b) by 830 days.

(21) Appl. No.: 12/983,421

(22) Filed: Jan. 3, 2011

(65) Prior Publication Data

US 2012/0171438 A1 Jul. 5, 2012

(51) Int. Cl.
| | | |
|---|---|---|
| B05D 3/00 | (2006.01) |
| B81B 7/04 | (2006.01) |
| B05D 5/12 | (2006.01) |
| B05D 7/24 | (2006.01) |
| B81C 1/00 | (2006.01) |
| B82Y 30/00 | (2011.01) |
| B82Y 40/00 | (2011.01) |

(52) U.S. Cl.
CPC ... *B81B 7/04* (2013.01); *B05D 3/20* (2013.01); *B05D 3/207* (2013.01); *B05D 5/12* (2013.01); *B05D 7/24* (2013.01); *B81C 1/00* (2013.01); *B82Y 30/00* (2013.01); *B82Y 40/00* (2013.01)
USPC ............. 427/561; 427/550; 427/598

(58) Field of Classification Search
CPC .... B05D 3/207; B05D 5/061; G11B 5/00804; G11B 5/714
USPC ........ 428/195.1, 206, 207, 403, 900; 427/548–550, 561, 598
See application file for complete search history.

(56) References Cited

U.S. PATENT DOCUMENTS

| | | | | |
|---|---|---|---|---|
| 3,878,367 | A * | 4/1975 | Fayling et al. | 360/131 |
| 5,364,689 | A * | 11/1994 | Kashiwagi et al. | 428/195.1 |
| 5,667,716 | A * | 9/1997 | Ziolo et al. | 252/62.52 |
| 6,872,785 | B2 | 3/2005 | Wang et al. | |
| 6,923,930 | B2 | 8/2005 | Ling et al. | |
| 7,105,229 | B2 | 9/2006 | Anderson | |
| 7,524,446 | B2 | 4/2009 | Zhang et al. | |
| 7,579,398 | B2 | 8/2009 | Fudemoto et al. | |
| 7,670,509 | B2 | 3/2010 | Jin et al. | |
| 7,691,468 | B2 * | 4/2010 | Benninger et al. | 428/206 |
| 7,718,738 | B2 | 5/2010 | Bohm et al. | |
| 7,835,047 | B1 * | 11/2010 | Raiford | 359/2 |
| 8,211,531 | B2 * | 7/2012 | Schmid et al. | 428/203 |
| 8,287,989 | B2 * | 10/2012 | Raksha et al. | 428/195.1 |

(Continued)

FOREIGN PATENT DOCUMENTS

| | | |
|---|---|---|
| EP | 1246205 A1 | 10/2002 |
| WO | 2009022167 A2 | 2/2009 |

OTHER PUBLICATIONS

European Search Report for corresponding Europe Application No. 11195207.3, dated Mar. 23, 2012.

(Continued)

*Primary Examiner* — Gerard Higgins
(74) *Attorney, Agent, or Firm* — McNees Wallace & Nurick LLC

(57) ABSTRACT

A process of forming a material having nano-particles and a material having nano-particles are disclosed. The process includes arranging nano-particles in a predetermined pattern within a matrix material. The material includes arranged nano-particles forming a predetermined pattern in the matrix material.

15 Claims, 3 Drawing Sheets

(56) References Cited

U.S. PATENT DOCUMENTS

| | | | |
|---|---|---|---|
| 8,343,615 B2* | 1/2013 | Raksha et al. | 428/195.1 |
| 2002/0121315 A1 | 9/2002 | Nomura | |
| 2003/0216539 A1* | 11/2003 | Siclovan et al. | 528/272 |
| 2005/0092424 A1 | 5/2005 | Zhang et al. | |
| 2005/0127134 A1 | 6/2005 | Lu et al. | |
| 2005/0170149 A1 | 8/2005 | Buczek et al. | |
| 2005/0247904 A1 | 11/2005 | Raj et al. | |
| 2006/0094320 A1 | 5/2006 | Chen et al. | |
| 2007/0092716 A1 | 4/2007 | Guo | |
| 2007/0142916 A1 | 6/2007 | Olson, Jr. et al. | |
| 2007/0155878 A1 | 7/2007 | Kim et al. | |
| 2008/0020193 A1 | 1/2008 | Jang et al. | |
| 2009/0159226 A1* | 6/2009 | Levit et al. | 162/146 |
| 2010/0003530 A1 | 1/2010 | Ganguli | |
| 2010/0140160 A1 | 6/2010 | Dubrow et al. | |
| 2010/0196695 A1 | 8/2010 | Garcia | |
| 2010/0203316 A1 | 8/2010 | Hata | |

OTHER PUBLICATIONS

Wang, M. et al., "Field-responsive superparamagnetic composite nanofibers by electrospinning", Polymer. Elsevier Science Publishers B.V, vol. 45, No. 16, pp. 5505-5514, Jul. 21, 2004.

Shah, D. et al., "Effect of nanoparticle mobility on toughness of polymer nanocomposites", Advanced Materials, vol. 17, No. 5, pp. 525-528, Mar. 8, 2005.

Zhang, B. et al., "Novel 1-3 metal nanoparticle/polymer composites induced by hybrid external fields", Composites Science and Technology, vol. 66, No. 11-12, pp. 1558-1563, Sep. 1, 2006.

Liu et al., "Reinforcing efficiency of nanoparticles: A simple comparison for polymer nanocomposites", Composites Science and Technology, vol. 68, No. 6, pp. 1502-1512, Nov. 5, 2007.

Yang, D. et al., "Fabrication of aligned fibrous arrays by magnetic electrospinning", Advanced Materials, vol. 19, pp. 3702-3706, Nov. 5, 2007.

Dyab, A. K. F. et al., "Fabrication of novel anisotropic magnetic microparticles", Journal of Materials Chemistry, vol. 19, pp. 3475-3481, Apr. 15, 2009.

Denver, H. et al., "Fabrication of polydimethylsiloxane composites with nickel nanoparticle and nanowire fillers and study of their mechanical and magnetic properties", Journal of Applied Physics, vol. 106, No. 6, pp. 064909-1-064909-5, Sep. 23, 2009.

Dai, Q. et al., "Self-assembled ferrimagnet-polymer composites for magnetic recording media", Nano Letters, vol. 10, pp. 3216-3221, Jul. 27, 2010.

Cho, H. B. et al., "Facile preparation of a polysiloxane-based hybrid composite with highly-oriented boron nitride nanosheets and an unmodified surface", Composites Science and Technology, vol. 70, No. 12, pp. 1681-1686, Oct. 31, 2010.

Fragouli, D. et al., "Directed assembly of magnetic nanoparticles in polymers: The formation of anisotropic plastic films containing aligned nanowires", Nanotechnology: Advanced Materials, vol. 1, pp. 854-857, 2010. (Abstract).

\* cited by examiner

PROCESS OF FORMING A MATERIAL HAVING NANO-PARTICLES AND A MATERIAL HAVING NANO-PARTICLES

FIELD OF THE INVENTION

The present invention is directed to materials and processes of forming materials. More specifically, the present invention is directed to a process of forming a material including nano-particles and a material including nano-particles.

BACKGROUND OF THE INVENTION

As manufactured products are subjected to more extreme environments and more extreme uses, limitations of properties of materials become a greater concern. In response, properties of materials are continuously being improved. Arrangement of particles in a predetermined pattern within a material can provide desired properties.

Known materials are strengthened by blending nano-particles with a matrix to form a reinforced blend. The reinforced blend includes increased viscosity and greater strength. However, the reinforced blend can be costly and can result in undesirable properties such as brittleness. In addition, the reinforced blend can include randomly oriented nano-particles throughout and is not able to be utilized for applications requiring ordered nano-particles.

A known process positions ordered nano-particles in a matrix by stretching the matrix and placing the nano-particles in voids created by the stretching of the matrix. The nano-particles are generally aligned consistently in the voids of the matrix. This process suffers from the drawback that the nano-particles must be substantially identical in size, thereby resulting in additional costs. Furthermore, the alignment of the nano-particles is unpredictable because it is limited by where the voids are formed in the matrix thereby preventing arrangement of the nano-particles.

In another known process, nano-fibers are positioned in a predetermined location and joined together with a matrix to form a flat ply having a desired design of the nano-fibers. The flat ply is cut into a pattern, stacked with additional flat plies, and/or bent to form a desired shape. This process suffers from the drawback that it results in unpredictable fracturing of fiber ends due to trimming, unpredictable fracturing of voids due to trimming, delamination, undesirable movement of nano-fibers, and undesirable scraps of nano-fibers.

Arranging of micro-fibers is known. As used herein, the term "micro-fiber" refers to visually discernible fibers having a diameter between about 15 microns and about 100 microns. In the past, micro-fibers have been arranged by mechanical systems for orienting the fibers and by applying a magnetic field. For example, in a known process, disc-shaped ferromagnetic flakes having a diameter of about 20 microns and a thickness of about 1 micron were arranged by applying a magnetic field. The flakes are of a sufficient size to be visually discernable and are of a sufficient size to be separated to substantially consistent sizes. The micro-fibers do not provide the properties available with nano-particles.

A material including nano-particles arranged in a predetermined pattern and a process of arranging nano-particles in a predetermined pattern would be desirable in the art.

BRIEF DESCRIPTION OF THE INVENTION

According to an exemplary embodiment, a process of forming a product includes providing a plurality of nano-particles and a matrix material and arranging the plurality of nano-particles into a predetermined pattern in the matrix material by applying a field.

According to another exemplary embodiment, a product is formed by a process of applying a magnetic field to a matrix material including a plurality of nano-particles thereby arranging the plurality of nano-particles to form a predetermined pattern.

According to another exemplary embodiment, a product includes a matrix material and a predetermined pattern in the matrix material, the predetermined pattern including a plurality of nano-particles.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Provided is a material including nano-particles arranged in a predetermined pattern and a process of arranging nano-particles in a predetermined pattern. Embodiments of the present disclosure permit nano-particles to be arranged in complex predetermined patterns providing new properties, permits the amount of scrap of nano-particles to be reduced or eliminated by having consistency and control in the application and arrangement of the nano-particles, permits use of a wider range of sizes of nano-particles for certain patterns such as linear patterns, permits reduction or elimination of voids in the matrix, permits a reduction or elimination of delamination, permits a reduction or elimination of undesirable movement of the nano-particles, permits unique properties available only through use of nano-particles, and combinations thereof.

In embodiments of the present disclosure, the material is part of or forms a coating (for example, on ceramic based SiC fiber whiskers, organic based carbon whiskers, organic based glass whiskers, and/or other forms of aramid fibers) or a composite (for example, a ceramic matrix composite, an organic matrix composite, and/or a thermoplastic and/or thermoset polymer).

Figure 1:
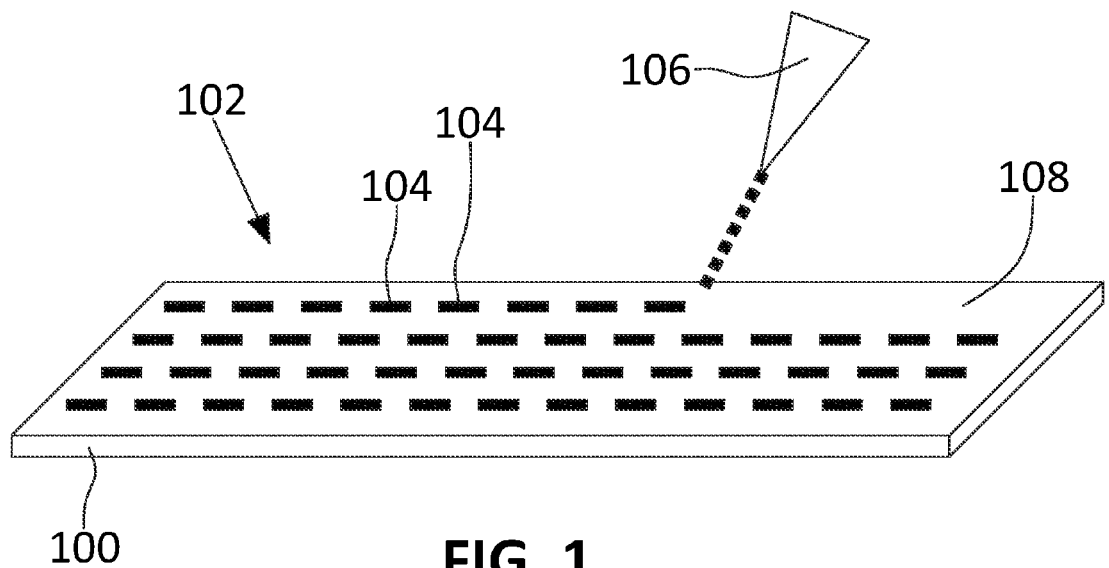
FIG. 1 schematically shows an exemplary material including arranged nano-particles according to an embodiment of the disclosure.
Figure 2:
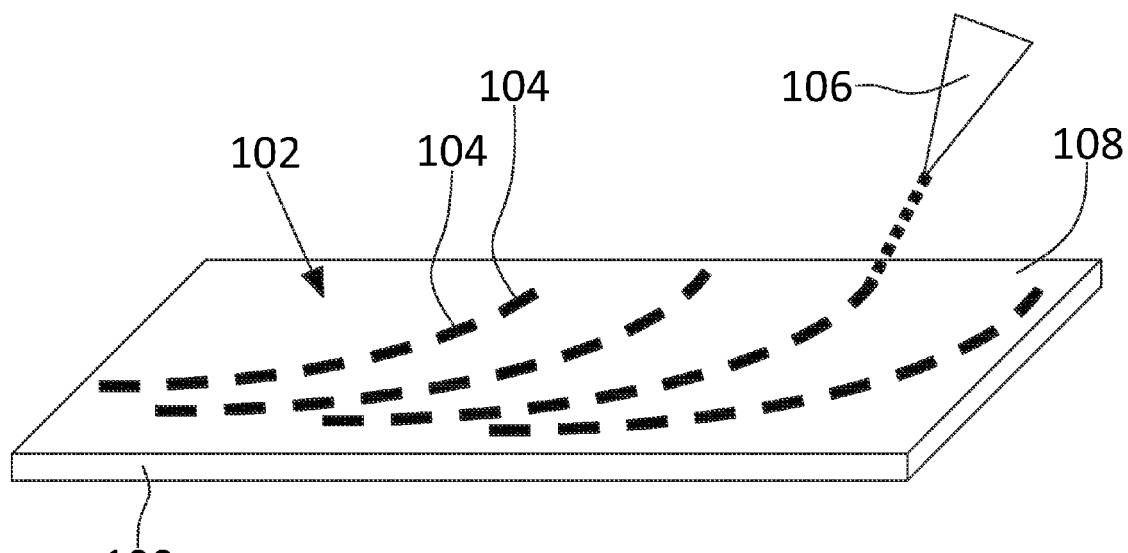
FIG. 2 schematically shows an exemplary material including arranged nano-particles according to an embodiment of the disclosure.

Referring to FIGS. 1-2, in an exemplary embodiment, a material 100 includes a plurality of the nano-particles 104 arranged and disposed in a matrix material 108 to form a predetermined pattern 102. As used herein, the term "nano-particle" refers to any structure having a size that is on the order of nanometers ($10^{-9}$ meters). Individually, the nano-particles 104 are visually indiscernible. For example, in embodiments of the present disclosure, the nano-particles 104 have a diameter of less than about 1500 nanometers, a diameter range of about 10 nanometers to about 1500 nanometers, a diameter range of about 10 nanometers to about 1000 nanometers, a diameter range of about 20 nanometers to about 500 nanometers, a diameter range of about 50 nanometers to about 500 nanometers, a diameter range of about 100 nanometers to about 500 nanometers, a diameter range of about 20 nanometers to about 400 nanometers, or a diameter range of about 40 nanometers to about 200 nanometers, the diameter being measured over a central 20%, 50%, 80%, or all of the nano-particle 104, for example, as measured through image analysis tools coupled with electron microscopy. Additionally or alternatively, in embodiments of the present disclosure, the nano-particles 104 have variance of less than 20%, variance of less than 5%, or variance of less than 1% over the region of greatest variance.

In embodiments of the present disclosure, the nano-particles 104 are nano-scaled graphene plates, nano-tubes, nano-fibers, nano-clay platelets, nano-rods, nano-scale reinforcements, other suitable nano-structures, or combinations thereof. In one embodiment, the nano-particles 104 are nano-fillers. Suitable nano-fillers include, for example, nano-scale graphene plates, nano-fibers, and nano-tubes.

The matrix material 108 is organic, metal, ceramic, glass, carbon-based, polymeric, or combinations thereof. As used herein, the term "polymer" and grammatical variations thereof refers to, but is not limited to, homopolymers, copolymers (for example, block, graft, random, and alternating copolymers), terpolymers, and blends thereof. In one embodiment, the matrix material 108 is a polymer including polylactides, polyactic acids, polyeolefins, polyacrylonitrile, polyurethane, polycarbonate, polycaprolactone, polyvinyl alcohol, cellulose, chitosan nylon, polystyrene, proteins, and combinations thereof. In one embodiment, the matrix material 108 is a polymer including poly(diallyldimethylammonium chloride), polyacrylic acid, poly(allylamine hydrosulfate), poly(4-styrenesulfonic acid), poly(vinyl sulfate) potassium salt, 4-styrene sulfonic acid sodium salt hydrate, polystyrene sulfonate, polyethylene imine, other suitable polymers, or combinations thereof.

In one embodiment, the matrix material 108 is a polymer composed only of straight chain polyethyleneimine backbones, a block copolymer of a block of straight chain polyethyleneimine backbones, a water soluble polymer block (for example, polyethylene glycol, polypropionylethyleneimine, and/or polyacrylamide), a hydrophobic polymer block (for example, polystyrene or polyoxazolines including polyphenyloxazoline, polyoctyloxazoline, and polydodecyloxazoline), or polyacrylates (for example polymethyl methacrylate and polybutyl methacrylate).

The orientation a plurality of the nano-particles 104 are arranged in the predetermined pattern 102. The nano-particles 104 are applied in an arranged orientation within the matrix material 108 and/or blended with the matrix material 108 then arranged to form the predetermined pattern 102. As used herein, the term "predetermined pattern" refers to a designed arrangement. The designed arrangement is formed by knowing positioning and orienting of the nano-particles 104. The designed arrangement is formed by any suitable method including, but not limited to, using computer assisted design (CAD) programs. The term "predetermined pattern" includes an intentionally formed pattern and does not include a heterogeneously random arrangement, an inconsistently formed arrangement, or an unpredictable arrangement.

Referring to FIG. 1, in one embodiment, the predetermined pattern 102 includes the plurality of the nano-particles 104 being arranged in a substantially parallel orientation. Referring to FIG. 2, in one embodiment, the predetermined pattern 102 includes the plurality of the nano-particles 104 being arranged such that a portion of the plurality of the nano-particles 104 are arranged in substantially linear orientation and a portion of the plurality of the nano-particles 104 are arranged in a curved orientation. In one embodiment, the predetermined pattern 102 is a complex predetermined pattern (for example, a circuit pattern, a non-linear pattern, a curved pattern, or a geometric pattern such as a square, a rectangle, a circle, an oval, or other suitable shape).

In one embodiment, the nano-particles 104 are arranged by application of a magnetic force. In this embodiment, the nano-particles 104 are magnetic or magnetized. In this embodiment, a magnetic field is generated, the nano-particles 104 are arranged by applying the magnetic field, and the matrix material 108 is cured thereby securing the position of the nano-particles 104. In a further embodiment, heat above a predetermined temperature is applied to remove the magnetic properties from the nano-particles 104. In an alternative embodiment, heat is not applied above a predetermined temperature and the magnetic properties of the nano-particles 104 are retained. In one embodiment, the nano-particles 104 are blended with the matrix material 108 then arranged. In this embodiment, the magnetic field is applied to the blend thereby arranging the nano-particles 104 in the predetermined pattern 102. Arrangement of the nano-particles 104 while in the blend includes a stronger magnetic field than arranging the nano-particles 104 outside of the blend. In one embodiment, the strength of the magnetic field corresponds to viscosity of the blend (for example, a higher strength magnetic field is applied for a higher viscosity blend).

Referring to FIGS. 1-2, in one embodiment, the nano-particles 104 are applied in an arranged orientation within the matrix material 108. For example, in this embodiment, the nano-particles 104 are arranged within an applicator 106. The applicator 106 orients the nano-particles 104 based upon the magnetic field and applies the nano-particles 104 with a consistent and controllable orientation. In this embodiment, very small nano-particles 104 that are otherwise difficult to arrange can be used because they can be applied in the consistent and controllable orientation.

The magnetic field is any suitable magnetic field. In one embodiment, the magnetic field is a magnetic field. In this embodiment, the nano-particles 104 are magnetic or magnetized. The magnetic field urges, attracts, repels, rotates, or otherwise adjusts the orientation of the nano-particles 104 within the magnetic field. In one embodiment, the magnetic field is applied for a predetermined duration and/or until the nano-particles 104 are arranged in the predetermined pattern 102. In one embodiment, a plurality of magnetic fields is used to arrange the nano-particles 104 into complex predetermined patterns. In one embodiment, a first magnetic field is applied and has a first strength and a second magnetic field is applied and has a second strength, the first strength differing from the second strength. In other embodiments, other fields (for example, ion fields or electric fields) are used for a tuned nano-particle tuned to a polarizing field line.

FIGS. 3-8 show steps of an exemplary process of arranging the nano-particles 104 into the predetermined pattern 102. In one embodiment, the exemplary process includes arranging the nano-particles 104 in the matrix material 108. In another embodiment, the exemplary process includes arranging the nano-particles 104 in the applicator 106 prior to applying the nano-particles 104 to the matrix material 108.

Figure 3:
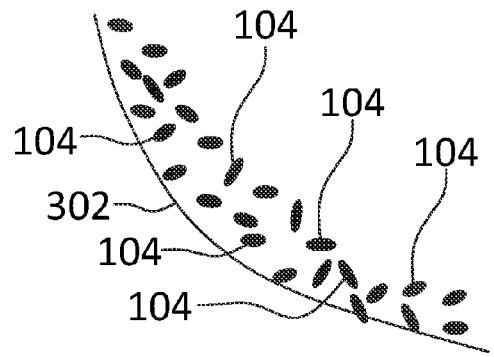
FIG. 3 schematically shows a random arrangement of nano-particles prior to an exemplary process according to an embodiment of the disclosure.
Figure 4:
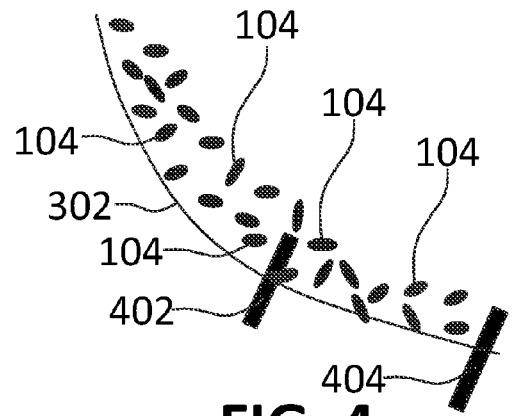
FIG. 4 schematically shows a positively charged probe and a negatively charged probe positioned along a random arrangement of nano-particles according to an exemplary process according to an embodiment of the disclosure.
Figure 5:
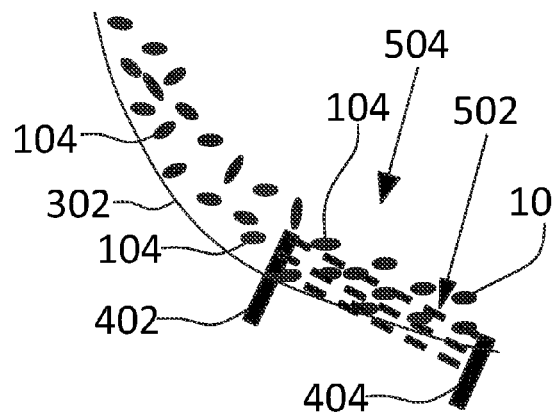
FIG. 5 schematically shows an arrangement of nano-particles oriented by application of a magnetic field according to an exemplary process according to an embodiment of the disclosure.
Figure 6:
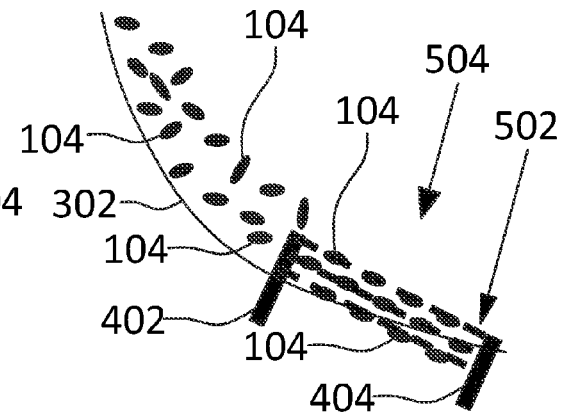
FIG. 6 schematically shows an arrangement of nano-particles positioned by application of a magnetic field according to an exemplary process according to an embodiment of the disclosure.
Figure 7:
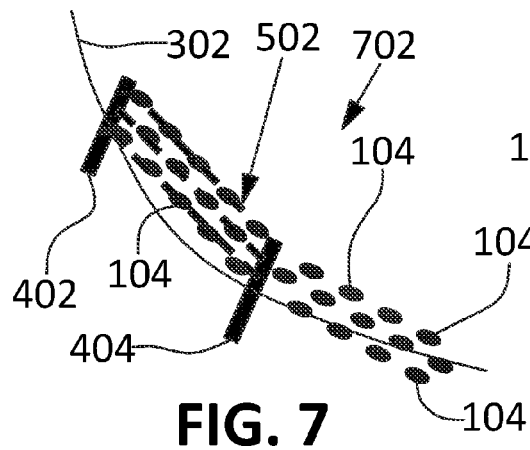
FIG. 7 schematically shows an arrangement of nano-particles positioned by application of a magnetic field at a second position according to an exemplary process according to an embodiment of the disclosure.
Figure 8:
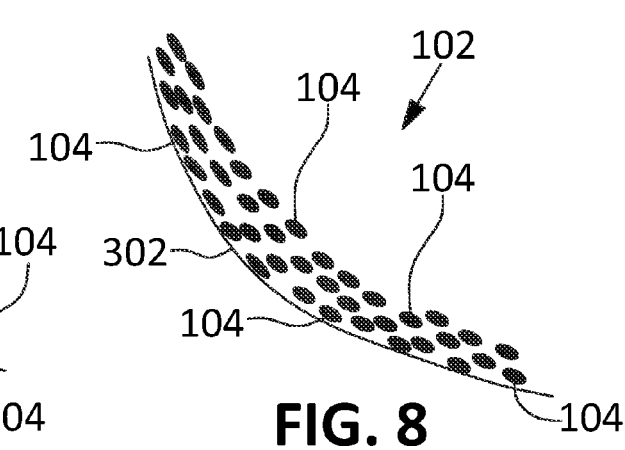
FIG. 8 schematically shows an arrangement of nano-particles positioned in a predetermined pattern according to an exemplary process according to an embodiment of the disclosure.

Referring to FIG. 3, in a first step, the nano-particles 104 are provided in a random arrangement proximal to a predetermined path 302. The predetermined path 302 is shown as a curved line but can be any suitable precursor to the predetermined pattern 102. Referring to FIG. 4, in a second step, a positively charged probe 402 and a negatively charged probe 404 are positioned along the predetermined path 302. Referring to FIG. 5, in a third step, the positively charged probe 402 and the negatively charge probe 404 are activated thereby generating a field (for example, a magnetic field, an ion field, an electric field, or a combination thereof) and adjusting the orientation of a portion 504 of the nano-particles 104 (for example, in one embodiment, the adjusting of the orientation includes aligning the portion 504 of the nano-particles 104 are aligned). Referring to FIG. 6, in a fourth step, the position of the portion 504 of the nano-particles 104 is adjusted (for example, in one embodiment, the position of the portion 504 is substantially along the predetermined path 302). Referring to FIG. 7, in an optional fifth step, the a positively charged probe 402 and a negatively charged probe 404 are positioned along the predetermined path 302 proximal to a second portion 702 of the nano-particles 104. FIG. 8 shows the nano-particles 104 according to the exemplary process arranged in the predetermined pattern 102.

Figure 9:
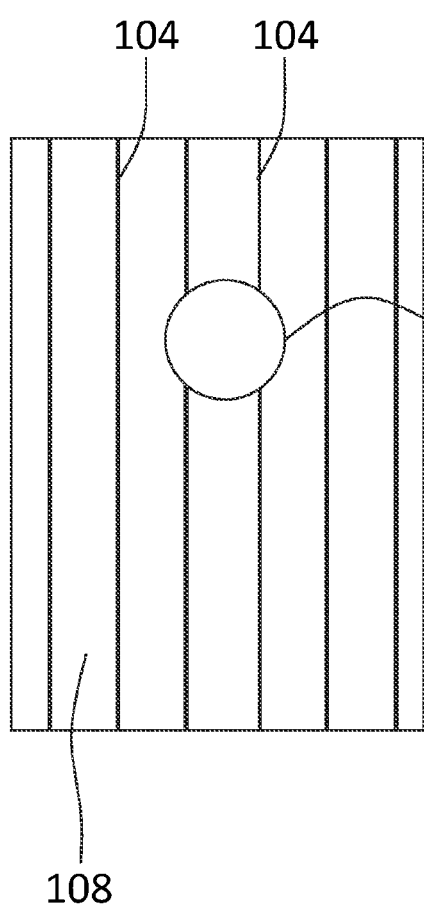
FIG. 9 schematically shows an arrangement of nano-particles prior to being positioned in a predetermined pattern according to an exemplary process according to an embodiment of the disclosure.
Figure 10:
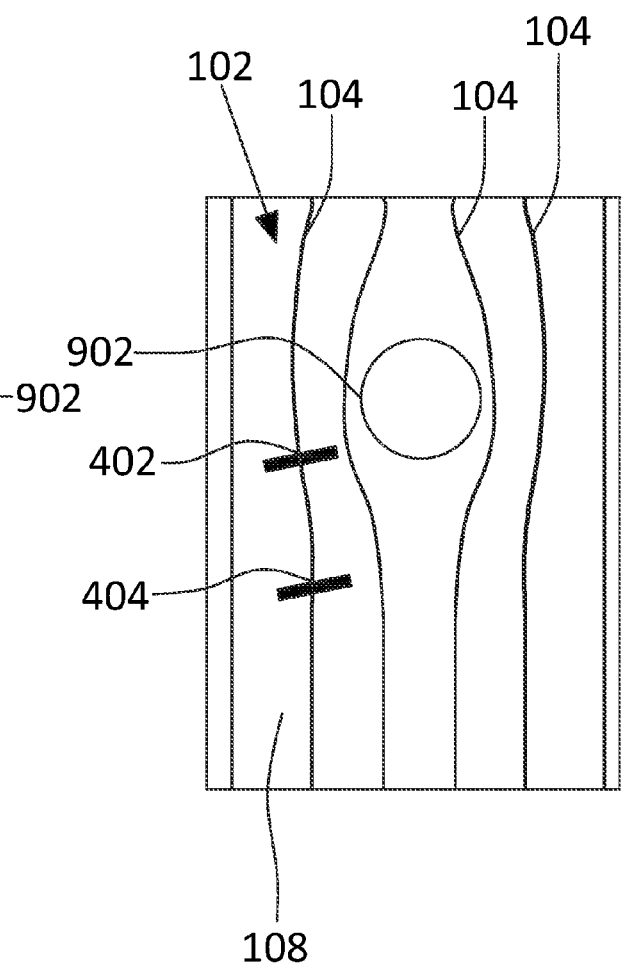
FIG. 10 schematically shows an arrangement of nano-particles positioned in a predetermined pattern according to an exemplary process according to an embodiment of the disclosure.

Referring to FIGS. 9-10, in one embodiment, the nano-particles 104 are positioned and arranged around a feature 902 such as a hole or knot in a fiber composite. FIG. 9 shows the nano-particles 104 extending through the feature 902 prior to application of a field. FIG. 10 shows the positively charged probe 402 and the negatively charged probe 404 positioned and activated to form the predetermined pattern 102 of the nano-particles 104. In this embodiment, the predetermined pattern 102 resembles a hardwood plywood product. In other embodiments, the predetermined pattern 102 resembles any suitable wood grain pattern, any suitable marble pattern, any other natural design, any suitable unnatural design, an aesthetic design, or any other suitable pattern.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A process of forming a product, the process comprising:
providing a plurality of nano-particles and a matrix material;
arranging the plurality of nano-particles into a predetermined pattern in the matrix material by applying a magnetic field; and
curing the matrix material thereby securing the position of at least a portion of the nano-particles;
wherein the magnetic field is applied to an applicator thereby positioning at least a portion of the plurality of nano-particles within the applicator, the applicator arranging the plurality of nano-particles in the matrix material;
wherein the nano-particles have diameters of between 10 nm and 1,000 nm.

2. The process of claim 1, further comprising applying the matrix material having the predetermined pattern to a substrate as a coating.

3. The process of claim 2, wherein the coating is applied to an aramid fiber.

4. The process of claim 1, wherein the matrix material is selected from the group consisting of a ceramic matrix composite, an organic matrix composite, a thermoplastic polymer, thermoset polymer, and combinations thereof.

5. The process of claim 1, wherein at least a portion of the plurality of nano-particles is magnetic.

6. The process of claim 1, wherein at least a portion of the plurality of nano-particles is magnetized.

7. The process of claim 1, wherein the magnetic field is applied to a blend of the matrix material and the plurality of nano-particles.

8. The process of claim 1, wherein the predetermined pattern includes at least a portion of the nano-particles being parallel.

9. The process of claim 1, wherein the predetermined pattern includes at least a portion of the nano-particles being in a line.

10. The process of claim 1, wherein the predetermined pattern includes at least a portion of the nano-particles being non-linear.

11. The process of claim 1, wherein the predetermined pattern includes at least a portion of the nano-particles forming a portion of a curve.

12. The process of claim 1, wherein the predetermined pattern includes at least a portion of the nano-particles forming a portion of a circuit pattern.

13. The process of claim 1, wherein the nano-particles are arranged by applying a first magnetic field and a second magnetic field.

14. The process of claim 1, further comprising arranging the plurality of nano-particles in the applicator prior to applying the nano-particles to the matrix material.

15. The process of claim 1, wherein the predetermined pattern includes at least a portion of the nano-particles forming a portion of a complex predetermined pattern, wherein the complex predetermined pattern is selected from the group consisting of a circuit pattern, a non-linear pattern, a curved pattern, a square, a rectangle, a circle, and an oval.

* * * * *